United States Patent [19]

Funk et al.

[11] Patent Number: 5,147,213

[45] Date of Patent: Sep. 15, 1992

[54] ZERO INSERTION PRESSURE TEST SOCKET FOR PIN GRID ARRAY ELECTRONIC PACKAGES

[75] Inventors: Ruben A. Funk; Richard D. Twigg, both of Columbia, Mo.

[73] Assignee: Minnesota Mining and Manufacturing Company, St. Paul, Minn.

[21] Appl. No.: 784,476

[22] Filed: Oct. 24, 1991

[51] Int. Cl.⁵ .................................... H01R 11/22
[52] U.S. Cl. .................................... 439/266; 439/342
[58] Field of Search .............. 439/259, 260, 261, 262, 439/265, 266, 267, 268, 263, 264, 342, 270, 269

[56] References Cited

U.S. PATENT DOCUMENTS

| | | |
|---|---|---|
| 3,763,459 | 10/1973 | Millis . |
| 4,012,099 | 3/1977 | Worcester . |
| 4,314,736 | 2/1982 | Demnianiuk ........................ 439/264 |
| 4,343,524 | 8/1982 | Bright et al. . |
| 4,505,532 | 3/1985 | Hine et al. . |
| 4,509,812 | 4/1985 | Lotter ........................... 439/266 X |
| 4,744,768 | 5/1988 | Rios ....................................... 439/262 |
| 4,988,310 | 1/1991 | Bright et al. ........................ 439/342 |
| 5,002,499 | 3/1991 | Matsuoka ............................ 439/342 |
| 5,013,256 | 5/1991 | Matsuoka et al. ................... 439/264 |

*Primary Examiner*—Larry I. Schwartz
*Assistant Examiner*—Khiem Nguyen
*Attorney, Agent, or Firm*—Gary L. Griswold; Walter N. Kirn; David W. Anderson

[57] ABSTRACT

A zero-insertion-pressure, pin-grid-array test socket is provided which includes a novel toggle mechanism for opening an array of contacts within the socket to accept a component for testing and closing the contacts after insertion of the component. The toggle mechanism comprises two links and a hinge pin disposed between and connecting the links. A handle is connected to one of the links and the hinge pin and movement of the handle causes separation of the links which in turn causes movement of a plate resulting in the opening or closing of the array of contacts.

11 Claims, 3 Drawing Sheets

ZERO INSERTION PRESSURE TEST SOCKET FOR PIN GRID ARRAY ELECTRONIC PACKAGES

TECHNICAL FIELD

The present invention relates generally to test sockets for electronic devices and particularly to test sockets for electronic packages having their contact pins arranged in a grid array, which test sockets require that no pressure be placed on the contact pins during insertion and removal of the electronic package from the test socket.

BACKGROUND OF THE INVENTION

Test sockets of the type described herein are used in electrical and/or burn-in (heated) testing of electronic components prior to their ultimate mounting in an electronic device of which they are to become a part. It is necessary in such a test socket that the contact pins of the component not be damaged by insertion or withdrawal from the test socket, that insertion and withdrawal be accomplished rapidly and without undue forces being exerted on the component or the test socket and that reliable electrical contact be made with every contact pin of the component.

There is described in U.S. Pat. No. 3,763,459 a zero or low insertion force socket with which integrated circuits and electronic components in devices such as dual-in-line packages can be easily inserted, tested and evaluated, and thereafter easily withdrawn. This type of device is known as a high cycle or test socket, as opposed to a connector mounted on a circuit board and into which the package will be inserted to remain for an extended length of time.

The socket disclosed in the aforementioned patent is comprised of a housing of three stacked members. The middle member moves back and forth between the upper and lower members that are fastened together. U-shaped contact elements are positioned in the socket with the two contact arms extending up through aligned openings in the middle and upper members. The contact arms are in the open position, i.e., spaced apart in the relaxed position. The openings through which the contact arms extend have a concave surface portion so that upon moving the middle member axially, the contact arms are brought into engagement with the component leads positioned therebetween and are wrapped around them partially by the concave surfaces to effect good electrical contact. Axial movement of the middle member is produced by a cam attached to a rod which may be the socket, the force required to move the middle member may be excessive.

SUMMARY OF THE INVENTION

The present invention is intended to produce a test socket of the above type which requires substantially less force to produce motion of the movable plate and operates in a more positive manner by providing a movable plate and a cover plate atop the movable plate, the movable plate and the cover plate having aligned, vertical holes therein into which are inserted contacts having two connected arms forming a U-shape which is aligned in the direction of movement of the movable plate and a toggle mechanism for producing movement of the movable plate relative to the cover plate. The toggle mechanism includes a first link, a second link, a hinge pin connecting the first and the second links and a handle attached to one of the first or second links and preferably the hinge pin so that rotation of the handle to a position wherein the ends of the first and the second links most distant from the hinge pin and the hinge pin are aligned results in maximum separation of the link ends and rotation of the handle away from the position of maximum separation of the link ends results in movement of the link ends toward each other. The toggle mechanism is captured between the cover plate and the movable plate so that movement of the link ends away from each other causes movement of the movable plate relative to the cover plate and movement of one of the contact arms toward the other contact arm and movement of the link ends toward each other permits movement of the movable plate in a direction allowing separation of the contact arms.

The test socket may include a base plate disposed such that the movable plate and the toggle mechanism are located between the base plate and the cover plate and may further include a spring disposed either between the toggle mechanism and the cover plate or the toggle mechanism and the movable plate for providing a smoother operating action, limiting the force applied by the toggle mechanism to the movable plate and compensating for expansion of the various parts if the test socket is to be heated during testing. Also, the first link and the second link adjacent the hinge pin may be concave to partially surround the hinge pin and permit rotational movement of the hinge pin relative to the links but prevent translational movement of the hinge pin relative to the links.

BRIEF DESCRIPTION OF THE DRAWINGS

The present invention will be more thoroughly described with reference to the accompanying drawings, wherein like numbers refer to like parts in the several views and wherein.

DESCRIPTION OF THE PREFERRED EMBODIMENTS

Figure 1:
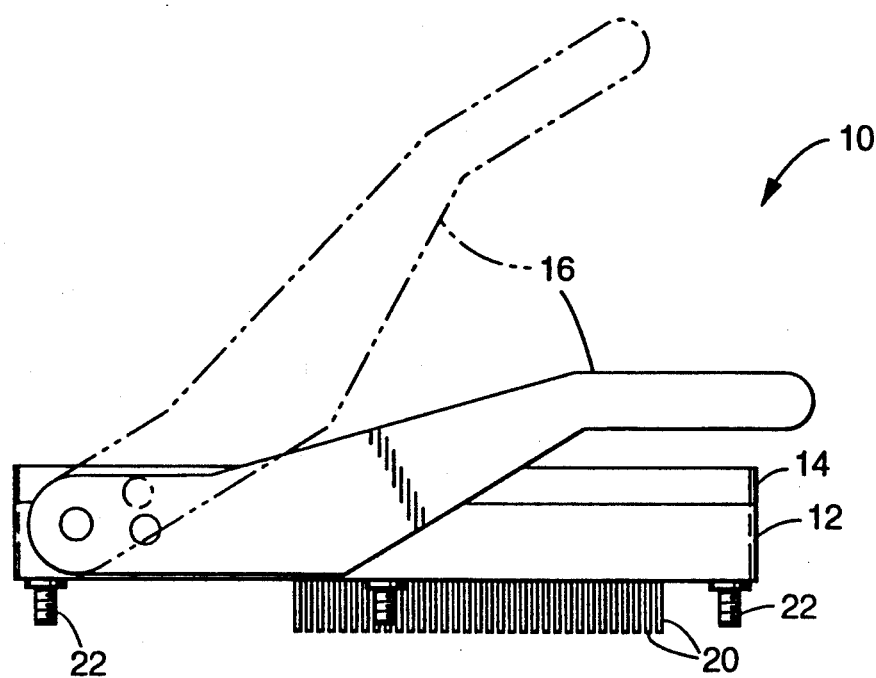
FIG. 1 is a side elevational view of a test socket according to the present invention.
Figure 2:
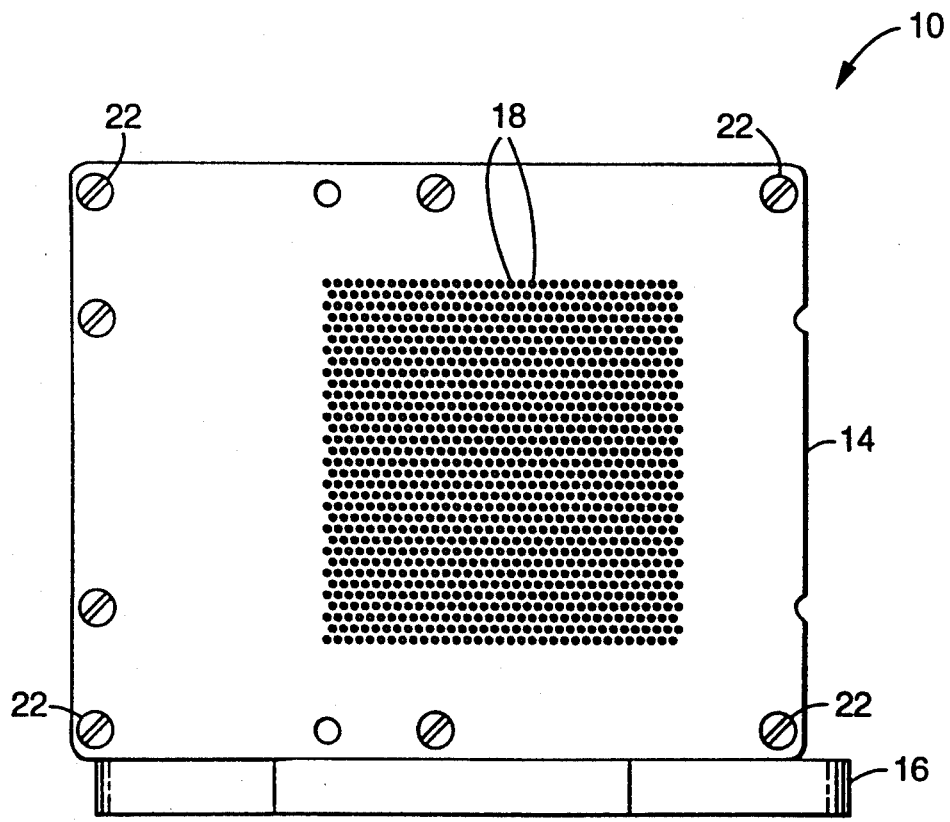
FIG. 2 is a top plan view of the test socket of FIG. 1.

FIGS. 1 and 2 illustrate a zero insertion pressure (ZIP) pin grid array (PGA) test socket, generally indicated as 10, which includes a base plate 12, a cover plate 14 and a handle 16. The test socket 10 is called a pin grid array test socket 10 because the cover plate 14 and the base plate 12 include a series of holes 18 laid out in a rectilinear pattern adapted to accept an identical contact pin pattern of a so-called pin grid array electronic component consisting of integrated circuits or other electronic devices encapsulated in a housing from which depends contact pins for attachment of the component to a larger device such as a circuit board of a computer.

The test socket 10 is provided to facilitate testing of the electronic component prior to permanent or semipermanent installation of the component in the ultimate electronic device. Within the pin grid array holes 18 of the test socket 10 are electrical contacts 20 which extend through the base plate 12 for attachment, usually by soldering, to a test circuit board (not shown). Also extending from the base plate 12 are mounting screws 22 which are used to increase the mechanical integrity of the test socket 10 mounting on the test circuit board.

Figure 3:
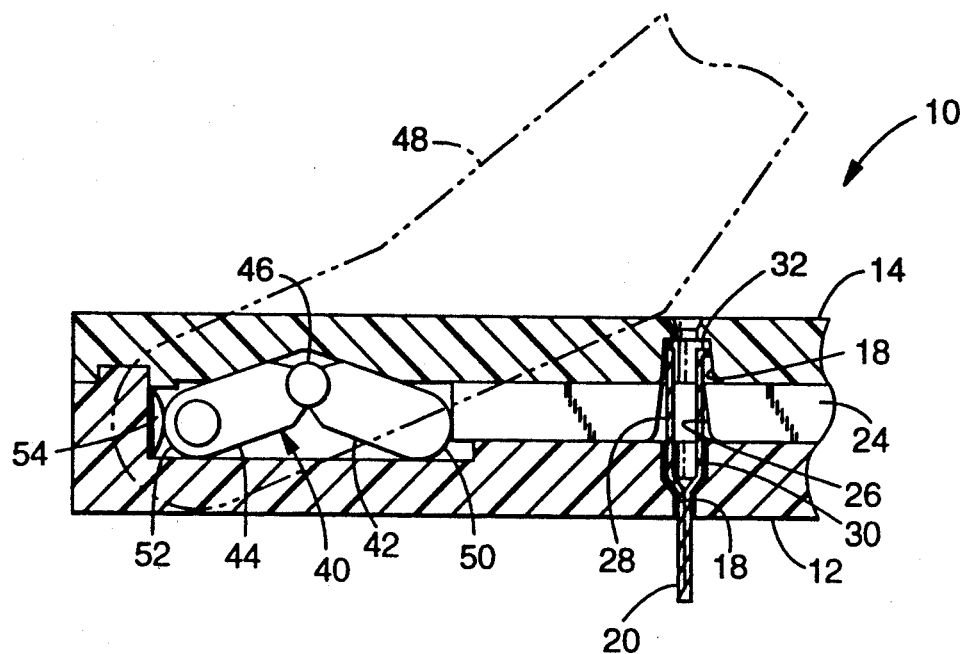
FIG. 3 is a side elevational view of a portion of the test socket of FIG. 1 with a cover plate and a base plate in cross-section and a toggle mechanism in a position for the acceptance of an electronic device for test.
Figure 4:
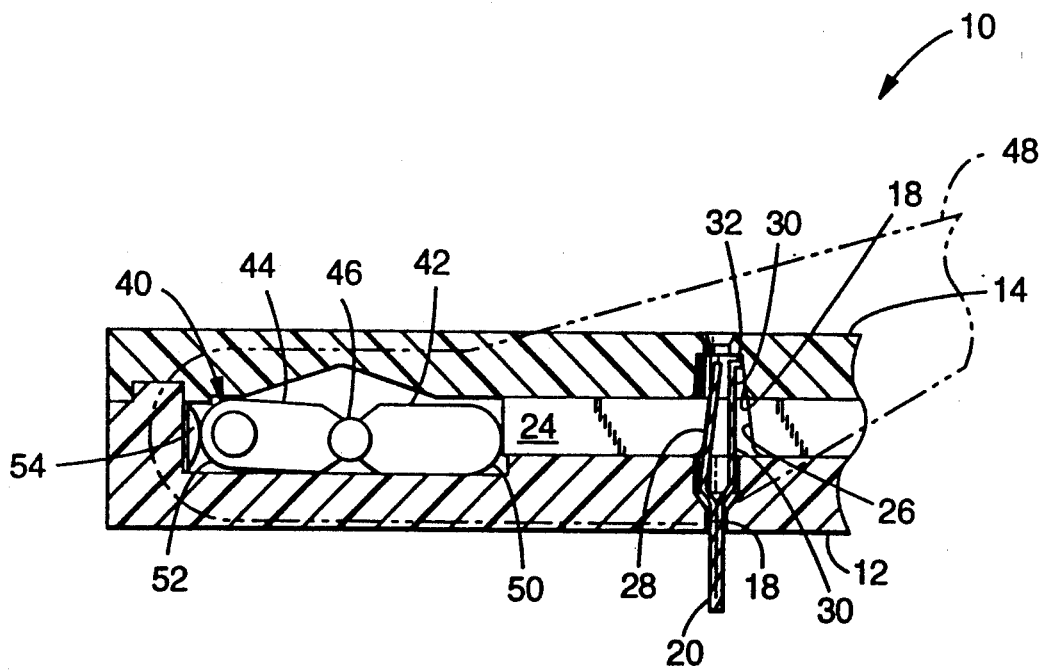
FIG. 4 is a side elevational view of a portion of the test socket of FIG. 1 with the cover and base plates in cross-section and a toggle mechanism in a position for the testing of an electronic device

FIGS. 3 and 4 illustrate the internal details of the test socket 10 and reveal that the contacts 20 extend through a movable plate 24 disposed between the base plate 12 and the cover plate 14. The movable plate 24 includes holes 26 corresponding in number and location to the holes 18 located in the base 12 and cover 14 plates, and is free to slide relative to the base and cover plates 12, 14 as shown in FIGS. 3 and 4. FIG. 3 illustrates that the contacts 20 are U-shaped with two upstanding arms 28 and 30 extending from the base plate 12 to the cover plate 14. The contact arm 28 is free to move within the holes 18 and 26 in the base plate 12, the cover plate 14 and the movable plate 24, while the upstanding contact arm 30 is restrained from movement within the holes 18 and 26 by a finger 32 contacting the hole 18 in the cover plate 14. Absent any external forces, the movable plate 24 will be held in the position shown in FIG. 3 by the combined force exerted by the resiliency of hundreds of contacts 20 disposed within the test socket 10. With the movable plate 24 in the position shown in FIG. 3, the contact arms 28 and 30 are separated and can freely accept the lead of a component to be tested, hence the nomenclature "zero insertion pressure". When the movable plate 24 is slid to the position shown in FIG. 4, the contact arm 28 is forced toward the other contact arm 30 and will grip the component lead inserted therebetween. Electrical contact can then be made through the end of the contact 20 to the test circuit board and the component electrically tested. This electrical testing can be performed in a heated environment, providing additional stress on the component to rapidly indicate a component prone to failure or cause the failure of a marginal component.

Thus far this description has described conventional components of existing test sockets available to the electronics industry. The present invention resides in the mechanism used to force the movable plate 24 toward the contacts 20 and cause closure of the contact arms 28 and 30 relative to the component leads inserted into the holes 18. Prior test socket simply used a cam disposed between the base plate 12 and the cover plate 14 to effect movement of the movable plate 24. Although reliable, this method required that excessive forces be applied to a handle attached to the cam. The present invention utilizes a toggle mechanism which greatly decreases the forces which need be applied and results in a more positive movement of the movable plate 24.

The toggle mechanism is generally indicated as 40 and includes a first link 42, a second link 44, a hinge pin 46 connecting the first link 42 and the second link 44, and a handle 48 shown in phantom lines in FIGS. 3 and 4. The toggle mechanism 40 is shown in a relaxed position in FIG. 3 wherein the handle 48 has been rotated upwardly to permit the ends 50 and 52 of the links 42 and 44 to approach each other in response to force against the end 52 exerted by the movable plate 24, in turn in response to forces generated by the resilient contacts 20.

FIG. 4 illustrates the toggle mechanism 40 in an extended position wherein the handle 48 has been rotated to align the ends 50 and 52 of the links 4 and 44 with the hinge pin 46, a position in which maximum separation of the link ends 50 and 52 occurs. Close observation of FIG. 4 will reveal that the toggle mechanism 40 has actually been rotated very slightly beyond this point of maximum separation wherein the ends 50 and 52 of the links 42 and 44 are aligned. This "over toggle" or "over center" position of the links 42 and 44 causes the links 42 and 44 in the area of the hinge pin 46 to be forced against the base plate 12 by the reactive force produced on the movable plate 24, resulting in locking of the toggle mechanism in the position shown in FIG. 4. Rotation of the handle 48 from the position of FIG. 4 toward the position of FIG. 3 causes the ends 50 and 52 of the links 42 and 44 to move slightly farther apart as the toggle mechanism moves through the position of maximum separation of the link ends 50 and 52, wherein the ends 50 and 52 are aligned with the hinge pin 46, and then move toward each other as the hinge pin 46 is moved further out of alignment with the ends 50 and 52 of the links 42 and 44.

The test socket 10 may be provided with a compensator spring 54 against which the toggle mechanism 40 may bear in its extension and which operates to smooth operation of the toggle mechanism 40, limit the force which is applied to the movable plate 24 and compensate for dimensional changes of the components of the test socket 10 during testing in a heated environment. This spring 54 is preferably a leaf spring to reduce the overall size of the test socket 10, but may be helical compression springs or a block of resilient material. The spring 54 may be disposed between the base plate 12 and the toggle mechanism 40 as shown or may be positioned between the toggle mechanism 40 and the movable plate 24.

The first link 42 adjacent the movable plate 24 preferably has a length equal to the width of the movable plate 24 so that forces are evenly distributed along the width of the movable plate 24, but may be a single, shorter length if centered with respect tot he movable plate 24 or a number of segments distributed along the width of the movable plate 24. Likewise, the second link 44 may be a single piece or many and may be of various lengths, so long as forces generated by the toggle mechanism are evenly transmitted to the movable plate 24.

The hinge pin 46 is illustrated as being cylindrical and the ends of the links 42 and 44 adjacent the hinge pin 46 include concavities which provide positive engagement between the links 42 and 44 and the hinge pin 46. This is the preferred arrangement, but the hinge pin 46 may have any cross-sectional shape so long as positive engagement with the links 42 and 44 is provided. For example, the hinge pin may be diamond-shaped in cross-section and the links 42 and 44 may be notched to accept such a pin 46. Rotational movement of the links 42 and 44 relative to the hinge pin 46 must be accommodated, but translational movement of the links 42 and 44 relative to the hinge pin must be prevented.

It will be seen in FIGS. 3 and 4 that the second link 44 moves with the handle 48 and is thus attached thereto. It is preferable that the hinge pin 46 also be attached to the handle 48, although the handle 48 and the hinge pin 46 need not be connected if positive engagement between the hinge pin and 46 and the links 42 and 44 is provided. The second link 44 may be pinned, welded or otherwise mechanically fastened to the handle 48 or may be formed integrally with the handle 48. Alternatively, the handle 48 may be connected to the first link 42 rather than the second link 44. This possibility will be discussed below. The hinge pin 46 is preferably interference fit into a hole in the handle 48 but also may be welded or otherwise conventionally fastened to the handle 48.

Figure 5:
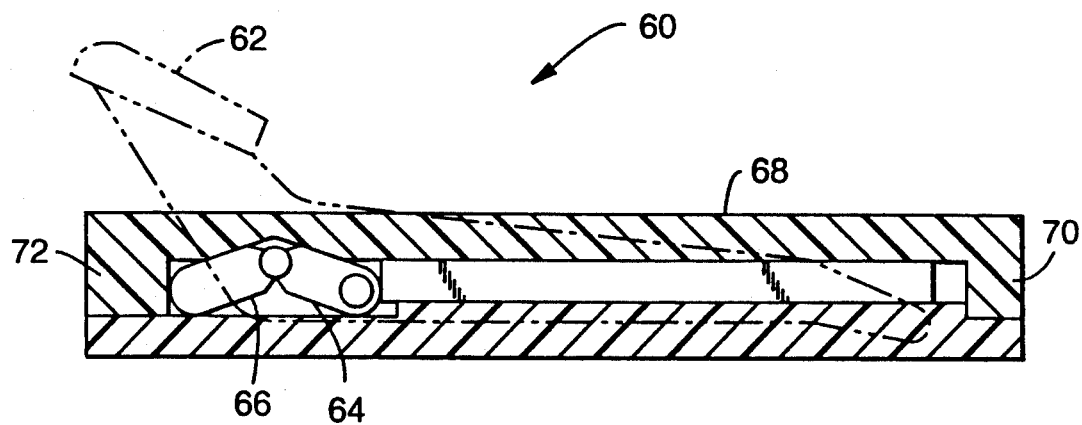
FIG. 5 is a side elevational view of an alternate embodiment of a test socket according to the present invention with a cover plate and base plate in cross-section and a toggle mechanism in a position to accept an electronic device for test.
Figure 6:
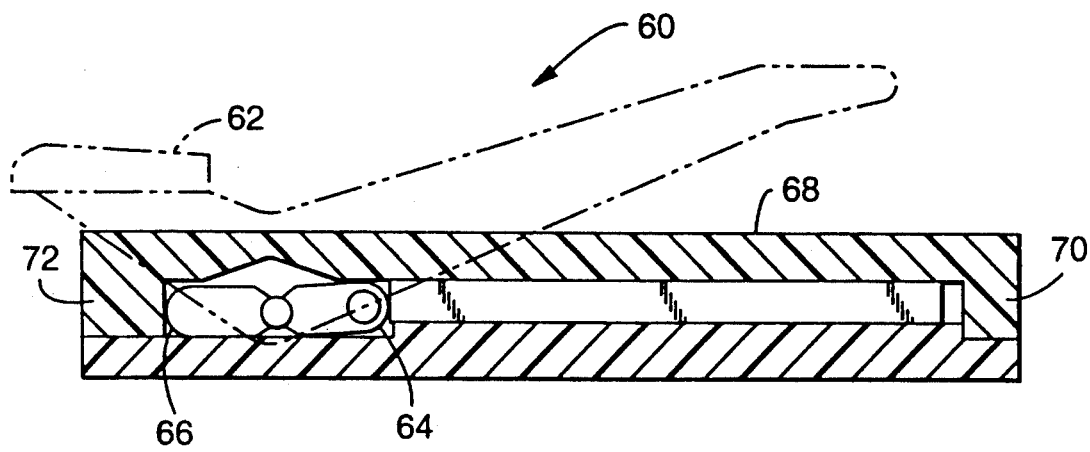
FIG. 6 is a side elevational view of the test socket of FIG. 5 according to the present invention with the cover plate and base plate in cross-section and the toggle mechanism in a position to test an electronic device.

FIGS. 5 and 6 illustrate a second embodiment of a test socket 60 according to the present invention which illustrates a number of differences from the embodiment described above, but which operates in substantially the same fashion. In FIGS. 5 and 6, a handle 62 is provided which has two ends rather than one so that a downward motion may be used to either open or close the test socket 60. Also, the handle is shown connected to the link 64 adjacent the movable plate 24 rather than the more remote link 66. Further, a cover plate 68 is illustrated which has a slightly different configuration than the previous cover plate 14. The cover plate 68 includes dependent legs 70 and 72 which support the cover plate 68 above the movable plate 24 and provide a surface against which the toggle mechanism 40 may bear, as opposed to the construction of FIGS. 1 to 4 wherein the bearing surface for the toggle mechanism was provided by an upward extension of the base plate 12. It will be seen that the construction of FIGS. 5 and 6 would allow the base plate 74 to be eliminated and the test socket 60 comprising the movable plate 24, the toggle mechanism 40 and the cover plate 68 mounted directly on the test circuit board. Finally, the spring 54 has been eliminated in FIGS. 5 and 6.

Figure 7:
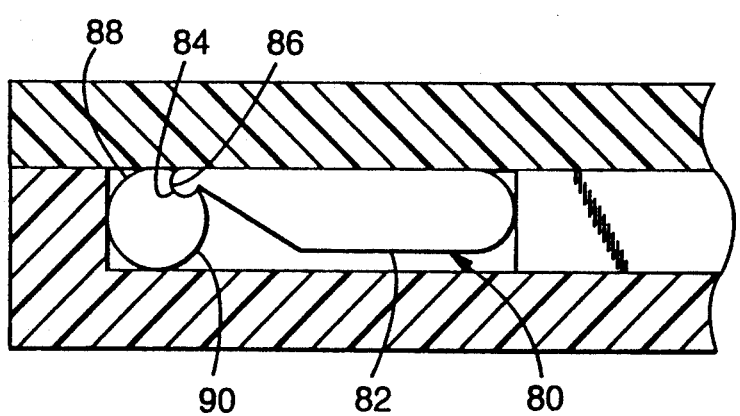
FIG. 7 is a side elevational view of an alternate embodiment of a toggle mechanism according to the present invention in a test socket with the cover plate and base plate in cross-section and the toggle mechanism in a position to accept an electronic device for test.

FIG. 7 illustrates a modified example of a toggle mechanism 80 in which the hinge pin is incorporated into one of the links 82 as a rounded, bulbous end 84. This end 84 fits into a socket 86 in a cylindrical rod 88 which defines the other toggle link 90. The rod 88 is preferably attached to and rotated by a handle (not shown) to operate the toggle mechanism 80 in a fashion similar to that of the toggle mechanism 40 described above. The toggle mechanism of FIG. 7 emphasizes the points that the links of the toggle mechanism may assume a variety of configurations and that the handle need not be attached to the hinge pin.

We claim:

1. A zero insertion pressure test socket comprising a movable plate and a cover plate atop said movable plate, said movable plate and said cover plate having aligned, vertical holes therein into which are inserted contacts having two connected arms forming a U-shape and aligned in the direction of movement of said movable plate and a toggle mechanism for producing movement of said movable plate relative to said cover plate, said toggle mechanism including a first link, a second link, a hinge pin connecting the first and the second links and a handle attached to one of the first or second links so that rotation of said handle to a position wherein the ends of said first and said second links most distant from said hinge pin and said hinge pin are aligned results in maximum separation of said link ends and rotation of said handle away from said position of maximum separation of said link ends results in movement of said link ends toward each other, and wherein said toggle mechanism is captured between said cover plate and said movable plate so that movement of said link ends away from each other causes movement of said movable plate relative to said cover plate and movement of one of said contact arms toward the other contact arm and movement of said link ends toward each other permits movement of said movable plate in a direction allowing separation of said contact arms.

2. A test socket according to claim 1 further including a base plate and wherein said movable plate and said toggle mechanism are located between said base plate and said cover plate.

3. A test socket according to claim 2 wherein said base plate includes an upward extension toward said cover plate and said toggle mechanism is captured between said base plate extension and said movable plate.

4. A test socket according to claim 3 further including a spring opposing said separation of said link ends.

5. A test socket according to claim 4 wherein said spring is disposed between said toggle mechanism and said base plate extension.

6. A test socket according to claim 5 wherein said spring is disposed between said movable plate and said toggle mechanism.

7. A test socket according to claim 1 further including a spring opposing said separation of said link ends.

8. A test socket according to claim 7 wherein said spring is disposed between said toggle mechanism and said cover plate.

9. A test socket according to claim 8 wherein said spring is disposed between said movable plate and said toggle mechanism.

10. A test socket according to claim 1 wherein said first link and said second link adjacent said hinge pin are concave to partially surround said hinge pin and permit rotational movement of said hinge pin relative to said links but prevent translational movement of said hinge pin relative to said links.

11. A test socket according to claim 1 wherein said hinge pin is formed by an extended portion of one of said links.

* * * * *